US010129657B2

(12) United States Patent
Robin et al.

(10) Patent No.: US 10,129,657 B2
(45) Date of Patent: Nov. 13, 2018

(54) UNIDIRECTIONAL LOUDSPEAKER ENCLOSURE

(71) Applicant: AKOUSTIC ARTS, Paris (FR)

(72) Inventors: Philippe Robin, La Gaude (FR); Ilan Kaddouch, Saint-Denis (FR)

(73) Assignee: AKOUSTIC ARTS, Paris (FR)

( * ) Notice: Subject to any disclaimer, the term of this patent is extended or adjusted under 35 U.S.C. 154(b) by 0 days.

(21) Appl. No.: 15/296,364

(22) Filed: Oct. 18, 2016

(65) Prior Publication Data

US 2017/0041718 A1 Feb. 9, 2017

Related U.S. Application Data

(63) Continuation of application No. PCT/FR2015/051068, filed on Apr. 20, 2015.

(30) Foreign Application Priority Data

Apr. 18, 2014 (FR) ..................................... 14 53563

(51) Int. Cl.
*H04R 29/00* (2006.01)
*H04B 3/00* (2006.01)
(Continued)

(52) U.S. Cl.
CPC ............... *H04R 19/02* (2013.01); *H04R 3/12* (2013.01); *H04R 17/00* (2013.01); *H04R 2217/03* (2013.01)

(58) Field of Classification Search
CPC .... G01N 29/14; G01N 29/346; G01N 29/348; G01H 17/00; A61H 23/0245;
(Continued)

(56) References Cited

U.S. PATENT DOCUMENTS

| | | | | |
|---|---|---|---|---|
| 5,194,824 A * | 3/1993 | Wu | ...................... | H03F 3/3001 330/255 |
| 6,778,672 B2 | 8/2004 | Breed | | |

(Continued)

OTHER PUBLICATIONS

International Search Report for International Application PCT/FR2015/051068, dated Jul. 8, 2015.

(Continued)

*Primary Examiner* — George C Monikang
(74) *Attorney, Agent, or Firm* — Burris Law, PLLC

(57) ABSTRACT

A loudspeaker enclosure designed to convert an electrical input signal into sound signals is provided. The enclosure comprises a signal processor suitable for generating, from the electrical input signal, a modulated electrical signal using an ultrasonic carrier. The enclosure comprises a source suitable for producing ultrasonic signals from the modulated electrical signal and for broadcasting said ultrasonic signals through a medium. The carrier is chosen such that the sound signals are at least partially produced while the ultrasonic signals are passing through the medium. A buffer device is suitable for allowing the transmission of the modulated electrical signal to said at least two piezo-electric transducers of the group and for keeping the voltage observed at the terminals of said at least two piezo-electric transducers of the group substantially equal to the voltage observed at the output of the signal processor.

14 Claims, 5 Drawing Sheets

(51) Int. Cl.

| | |
|---|---|
| ***H04R 27/00*** | (2006.01) |
| ***H04R 19/02*** | (2006.01) |
| ***H04R 3/12*** | (2006.01) |
| *H04R 17/00* | (2006.01) |

(58) Field of Classification Search

CPC .......... H04R 29/001; A61B 17/320068; A61B 2017/320088; A61B 17/22004; B06B 2201/55

USPC .......................................... 381/59, 77–80, 82

See application file for complete search history.

(56) References Cited

U.S. PATENT DOCUMENTS

| | | | | |
|---|---|---|---|---|
| 2005/0151589 | A1* | 7/2005 | Fallesen | H03F 1/30 330/259 |
| 2010/0277038 | A1 | 11/2010 | Cerofolini | |
| 2011/0181442 | A1* | 7/2011 | Nakayama | B60Q 5/008 340/933 |
| 2011/0198968 | A1 | 8/2011 | Sato | |
| 2011/0216920 | A1* | 9/2011 | Yamamoto | 381/120 |
| 2013/0064398 | A1* | 3/2013 | Galal | H03F 1/301 381/120 |
| 2013/0242702 | A1* | 9/2013 | Onishi | H04R 1/403 367/99 |
| 2013/0243224 | A1 | 9/2013 | Onishi | |
| 2014/0044283 | A1 | 2/2014 | Norris | |

OTHER PUBLICATIONS

Pompei, F. Joseph (Sep. 1999), "The use of airborne ultrasonics for generating audible sound beams". Journal of the Audio Engineering Society 47 (9): 726-731.

Westervelt, P. J. (1963). "Parametric acoustic array". Journal of the Acoustical Society of America 35 (4): 535-537.

Bellin, J. L. S.; Beyer, R. T. (1962). "Experimental investigation of an end-fire array". Journal of the Acoustical Society of America 34 (8): 1051-1054.

* cited by examiner

UNIDIRECTIONAL LOUDSPEAKER ENCLOSURE

CROSS-REFERENCE TO RELATED APPLICATIONS

This application is a continuation of International Application No. PCT/FR2015/051068, filed on Apr. 20, 2015, which claims the benefit of FR 14/53563, filed on Apr. 18, 2014. The disclosures of the above applications are incorporated herein by reference.

FIELD

The present disclosure relates to the field of unidirectional loudspeakers.

BACKGROUND

The statements in this section merely provide background information related to the present disclosure and may not constitute prior art.

In the field of loudspeakers, mastering the directivity of the radiation pattern of the sound source is an important parameter, in particular to allow uses in which the perception window cone—that is to say the typically conical area within which the listener perceives an acoustic signal the level of which is attenuated by less than 50% in comparison with the maximum level—should have an angle smaller than 50°. In particular, such loudspeakers find application when a sound should be diffused towards one single person or towards a reduced number of persons, in a limited area and/or at a distance from the loudspeakers. In particular, it may consist of the diffusion of messages in a public space or in a particular space, the diffusion of information, in a transportation means or at home for example, when a person should be able to hear a sound without the closely proximate other persons perceiving it.

A known technology for reaching these objectives is the use, in a loudspeaker, of ultrasounds sources, diffusing in a linear manner, a modulated signal resulting from the modulation of a sound signal by an ultrasonic carrier, said modulated signal being audible again by a human being during its crossing through a non-linear medium—herein, the air of the perception window cone. Indeed, the medium then behaves as a demodulator of the modulated signal. The diffusion of ultrasounds in the space being substantially linear, the directivity of such a loudspeaker turns out to be particularly high, and typically allows obtaining a perception window cone the angle of which is substantially 30°. For example, the patent document U.S. Pat. No. 6,778,672 describes the use of such a loudspeaker in an entertainment system for a vehicle.

The known loudspeakers implementing these principles use a matrix of piezoelectric transducers, which, from an input electrical signal, produce ultrasounds, diffused in the air in a linear manner. The input electrical signal is obtained by modulating the frequency or the amplitude of a sound signal by means of a signal processor, generally referred to by the acronym "DSP" for "Digital Signal Processor", by amplifying the modulated signal by means of an external power amplifier, and by routing the amplified modulated signal towards the set of piezoelectric transducers. Typically, the magnitude of the current in the board implementing the signal processor and the matrix of piezoelectric transducers reaches 2 amperes.

Still, the produced heat, in particular at the level of the piezoelectric transducers excited by the amplified modulated signal, is considerable and should therefore be dissipated. Furthermore, the external amplifier powering the piezoelectric transducers has to be equipped with heat dissipation devices, such as fans, thereby increasing the occupied volume and the weight of this equipment. In addition, since the amplifier cannot be directly integrated to the other components, an external separate module has to be provided, which complexifies the integration of the system and turns out to be barely practical.

SUMMARY

The present disclosure provides a directional loudspeaker comprising integrated amplifying means to power ultrasounds sources. The present disclosure also provides amplifying means for a directional loudspeaker with reduced size and/or weight, amplifying means for a directional loudspeaker providing a homogenous thermal distribution and a satisfactory dissipation of the heat generated by the ultrasounds sources, amplifying means for a directional loudspeaker which do not necessarily require active heat dissipation means, and a directional loudspeaker the amplifying means of which are not external.

More particularly, according to one aspect, the present disclosure relates to a loudspeaker adapted to convert an input electrical signal representing sound information, into acoustic signals. The loudspeaker includes:

a signal processor adapted to generate, at an output, from the input electrical signal, an electrical signal modulated by means of a carrier having a frequency substantially higher than 20 kHz;

a source capable of producing ultrasonic signals from the modulated electrical signal and diffusing said ultrasonic signals through a medium;

The carrier is chosen so that the acoustic signals are at least partially produced during the crossing of the medium by the ultrasonic signals. The source comprises groups of at least two piezoelectric transducers. Each group comprises a buffer device coupled between said at least two piezoelectric transducers of the group and the signal processor. The buffer device of each group is adapted to enable the transmission of the modulated electrical signal to said at least two piezoelectric transducers of the group and to maintain the voltage observed at the terminals of said at least two piezoelectric transducers of the group substantially equal to the voltage observed at the output of the signal processor. In particular, the acoustic signals are signals which are audible by a human the spectrum of which typically extends between 20 Hz and 20 kHz. The theoretical framework describing the used technology is described in particular in the following documents, which are incorporated herein by reference in their entirety:

Pompei, F. Joseph (September 1999), "The use of airborne ultrasonics for generating audible sound beams". *Journal of the Audio Engineering Society* 47 (9): 726-731;

Westervelt, P. J. (1963). "Parametric acoustic array". *Journal of the Acoustical Society of America* 35 (4): 535-537;

Bellin, J. L. S.; Beyer, R. T. (1962). "Experimental investigation of an end-fire array". *Journal of the Acoustical Society of America* 34 (8): 1051-1054.

The sounds the frequency of which is higher than 20 kHz are qualified as ultrasonic signals.

The piezoelectric transducers, in particular when these are excited by an amplitude-modulated signal, emit a considerable heat, which should be dissipated. On the contrary of the devices of the prior art, the loudspeaker according to the present disclosure does not require the use of an external amplifier, equipped with active cooling means, to power the transducers. Thus, by using at the output of the signal processor, analog-type buffer devices, and advantageously buffer devices comprising A or AB operation class amplifying means, powering at least two, and for example five, piezoelectric transducers, it is possible to provide an electronic board comprising the transducers connected to the analog buffer devices. This configuration allows avoiding the need for the presence of a bulky external amplifier, while providing a satisfactory dissipation of the heat generated by the transducers.

For example, the buffer device of each group comprises A and/or A-B operation class amplifying means.

The buffer device of each group may comprise at least one operational amplifier connected as a voltage follower, in linear mode and having a unitary voltage gain.

In one form, the buffer device of each group comprises two bridge-connected operational amplifiers. Thus, the use of a bridge mounting allows significantly increasing the effective voltage at the terminals of the piezoelectric transducers, and therefore providing more power.

The carrier used by the signal processor to generate the modulated electrical signal may be an amplitude-modulation carrier, a frequency-modulation carrier, or a pulse-width-modulation carrier. For example, the carrier used by the signal processor for the modulated electrical signal typically has a frequency of at least 40 kHz.

Advantageously, the signal processor comprises an amplification stage configured to adapt the voltage of the modulated signal to a nominal second level, upstream of the buffer devices.

Advantageously, an amplifier may be disposed downstream of the signal processor, and configured to adapt the voltage of the input electrical signal to a nominal first level. Thus, it is possible to set to an input electrical level, for example a signal derived from the headset output of a stereo player, by amplifying its voltage so as to adapt to the nominal input level of the signal processor. This leveling allows obtaining an optimum signal/noise ratio at the level of the signal processor.

For example, the acoustic signals are produced in a substantially conical area the apex of which is located at the center of the source and within which a listener perceives an acoustic signal the level of which is attenuated by less than 50% in comparison with a maximum level of the acoustic signal, and the angle of which is smaller than 50°, for example 30°.

In one form, the loudspeaker further includes an interface module, adapted to be coupled to an emitter module, via a coupling element. The interface module includes means for receiving and converting the input electrical signal, into a digital signal. The interface module includes the signal processor and said source capable of producing ultrasonic signals from the digital signal and diffusing said ultrasonic signals through a medium. The interface module and the emitter module are disposed on distinct mechanical supports which can be detached. Thus, it is possible to couple the emitter module to all the different types of interface modules which can be supported by the coupling element. Thus, it is possible to change and/or modify the interface module, and therefore manage different types of input signals, while keeping the emitter module. In particular, the interface module may include an interconnection module adapted to enable the mechanical, physical, electrical and logical coupling necessary to the receive of the electrical signal from an external audio source. As example, the interconnection module may include a "Jack"-type physical connector for receiving a symmetric or asymmetric signal at a line level as well as the electronic means for adapting the input impedance to a desired level. The interconnection module may also include one or several physical connector(s) of another type, for example RCA or optical connectors. The interconnection module may also include one or several digital interface(s), for example a USB or serial compatible interface. The interconnection module still may include one or several communications interface(s), for example a data network access module of the WiFi type, Bluetooth® type, Ethernet type or radiocommunication type such as the GSM or the 3G network. The coupling element may be configured so as to enable the mechanical coupling of the interface module to the emitter module, and to enable the transmission to the calculation module of the digitized signal at the output of the analog-digital conversion stage as well as the electric currents at the output of the power-supply module. Furthermore, the coupling element may be configured so as to couple a plurality of emitter modules in a chain fashion, and therefore to distribute the sound emissions over several emitter modules from one single input signal. Typically, the emitter module includes the signal processor—the digital calculation module, the digital-analog conversion stage, and the amplification stage—as well as the buffer devices and the groups of piezoelectric transducers. Hence, the emitter module and its configuration do not depend on the type of the signal. The interface module may also include, the amplifier, and the analog-digital conversion stage so as to digitize the signal leveled by the amplifier.

the interface module may include a power-supply module adapted to receive and/or supply the electrical energy necessary to power the interface module and the emitter module, and/or the coupling element. Thus, the power-supply module may include a coupling means, for example an electrical socket, to be coupled to an electrical network and/or a batteries system. The power-supply module may also include an electrical source, for example an accumulator, a batteries system or photovoltaic elements. The power-supply module may also include means (for example a transformer, or still a rectifier) for adapting the electrical characteristics of the received electric current to the needs and characteristics of the interface module, emitter module and/or coupling element. The power-supply module may be configured to deliver a plurality of electric currents, having different characteristics.

In one form, the mechanical supports of the interface module, the emitter module and the coupling module are configured so as to form, once secured, a substantially rectangular-shaped set. In particular, the mechanical support of the interface may be substantially triangular-shaped, for example taking up the shape of a right-angled triangle. For example, the mechanical supports of the interface module and the emitter module consist of printed circuit boards. Furthermore, the coupling element may be configured so that the interface module and the emitter module are spaced apart by at least 3 millimeters. For example, the shape of the support of the emitter module is an equivalent pentagon obtained by removing from a rectangular surface the triangular surface corresponding to the mechanical supports of the interface module. The dimensions of the interface module are typically chosen so that the hypotenuse of the right-angled triangle is smaller than or equal to the side of the emitter module.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
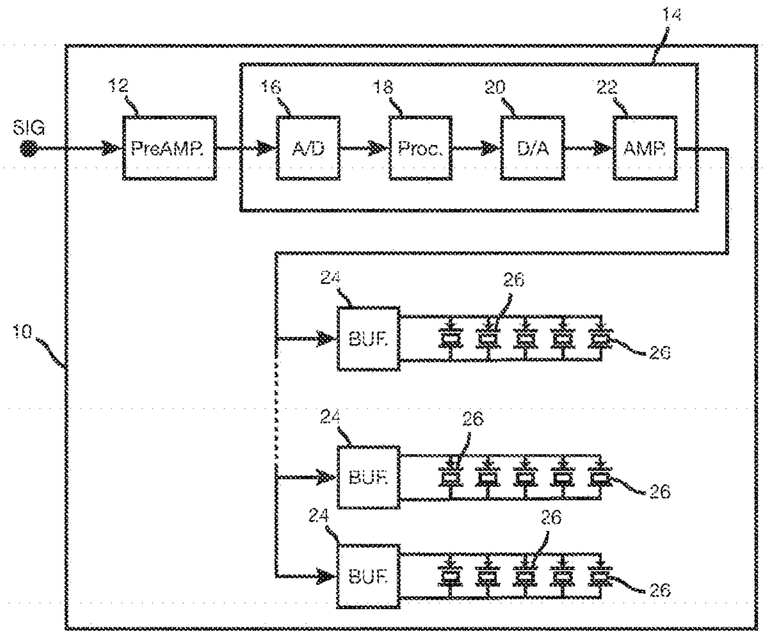
FIG. 1 is a block diagram of a unidirectional loudspeaker, according to one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 2:
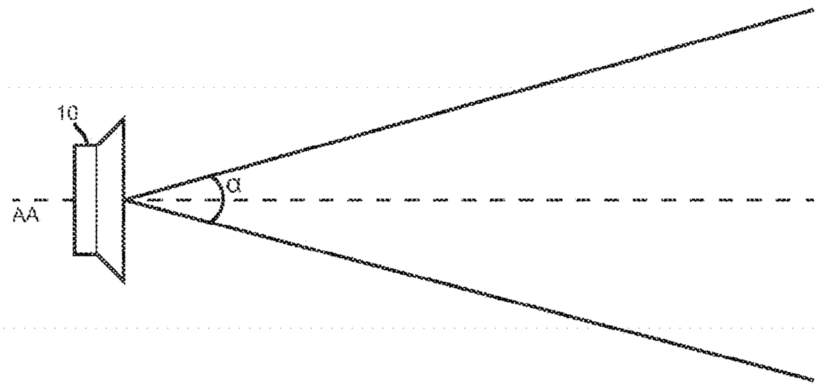
FIG. 2 is a schematic representing the perception window cone of the unidirectional loudspeaker of the present disclosure.

FIG. 1 illustrates through a block diagram a unidirectional loudspeaker 10, according to one form of the present disclosure. In particular, the loudspeaker 10 is adapted to convert an electrical signal SIG representing sound information, received at input, into acoustic signals AC audible by a human being the spectrum of which typically extends between 20 Hz and 20 kHz. Furthermore, the loudspeaker 10 is called unidirectional. As represented in FIG. 2, is meant by unidirectional a loudspeaker the acoustic signals of which are produced in a perception window cone the angle $\alpha$ of which is smaller than 50° and the axis AA of which passes through the center of the sound source of said loudspeaker. Is called perception window cone of an acoustic signal, an area, typically conical the apex of which is located at the center of the sound source of the loudspeaker, within which a listener perceives an acoustic signal the level of which is attenuated by less than 50% in comparison with the maximum level of the acoustic signal. In particular, the loudspeaker 10 can use an ultrasounds source. The theoretical framework describing the used technology is described in particular in the following documents:

Pompei, F. Joseph (September 1999), "The use of airborne ultrasonics for generating audible sound beams". *Journal of the Audio Engineering Society* 47 (9): 726-731;

Westervelt, P. J. (1963). "Parametric acoustic array". *Journal of the Acoustical Society of America* 35 (4): 535-537;

Bellin, J. L. S.; Beyer, R. T. (1962). "Experimental investigation of an end-fire array". *Journal of the Acoustical Society of America* 34 (8): 1051-1054.

The sounds the frequency of which is higher than 20 kHz are qualified as ultrasounds. The ultrasounds source of the loudspeaker 10 is adapted to diffuse in a linear manner, along the axis AA, a modulated signal MOD resulting from the modulation of the signal SIG by the ultrasonic carrier P. When the modulated signal MOD passes through the medium, the latter acts as a demodulator on the modulated signal MOD: the acoustic signal AC audible by a human being is then produced. The diffusion of ultrasounds in the space being substantially linear, the directivity of the loudspeaker turns out to be particularly high, and typically allows obtaining a perception window cone the angle $\alpha$ of which is substantially equal to 30°.

More particularly, a model describing the demodulation of the modulated signal MOD by the medium may be described by the following mathematical expression:

$$p_2(x,t) = K \cdot P_c^2 \cdot \frac{\partial^2}{\partial t^2} E^2(x,t)$$

with $p_2(x, t)$ the audible secondary acoustic pressure wave, corresponding to the acoustic signal AC, resulting from the demodulation of the modulated signal MOD by the medium;

K, a parameter dependent on physical parameters;

$P_c$ the sound pressure level of the modulated signal MOD;

E(x, t) the envelope function of the carrier P.

The ultrasonic carrier P, described by the envelope function E(x, t), may be a frequency-modulation carrier, a pulse-width-modulation or PWM carrier, or still an amplitude-modulation carrier.

In the form illustrated in FIG. 1, the unidirectional loudspeaker 10 includes an input for receiving the electrical signal SIG, an amplifier 12, a signal processor 14, buffer devices 24 and piezoelectric transducers 26.

The electrical signal SIG represents sound information in the form of an electrical signal. In particular, it may be delivered by an audio source, for example at the headset output of a digital audio player, at the line output or at RCA connectors of a cd-rom player.

The amplifier 12 is configured to adapt the voltage of the signal SIG to a nominal level N1. More particularly, the nominal level N1 is equal to the nominal level at the voltage input of the signal processor 14. Typically, the nominal level N1 is in the range of 2V peak-to-peak. This leveling of the signal SIG allows obtaining an optimum signal/noise ratio at the level of the signal processor 14.

The signal processor 14 is adapted to generate, form the signal SIG leveled by the amplifier 12, the modulated signal MOD by the carrier P. The signal processor 14 is adapted for the treatment of digital audio data. For example, a digital treatment processor, generally referred to by the acronym "DSP" for "Digital Signal Processor", may be used. The signal processor 14 comprises an analog-digital conversion stage 16 so as to digitize the signal SIG leveled by the amplifier 12. The signal processor 14 further includes a digital calculation module 18. As example, the calculation module 18 may comprise "multiply-accumulate" type calculation units capable of treating 16 data coded on 16 bits per clock cycle, and delivered at a calculation speed of 100 Mips. The calculation module 18 is configured to implement a program for modulating the digitized signal SIG using the ultrasonic carrier E (x, t). More particularly, the calculation module 18 may be configured to digitally synthesize the amplitude-modulation ultrasonic carrier at a frequency of 40 kHz, and to modulate the digitized signal SIG with said ultrasonic carrier. The signal processor 14 comprises a digital-analog conversion stage 20 so as to transpose the digital modulated signal in the analog field. The signal processor 14 comprises an amplification stage 22 configured to adapt the voltage of the modulated signal to a nominal level N2. More particularly, the nominal level N2 is chosen based on the electrical characteristics of the buffer devices 24. Typically, the nominal level N2 is in the range of 24V peak-to-peak The signal processor 14 delivers, at output, a modulated signal MOD in the analog field.

Figure 3:
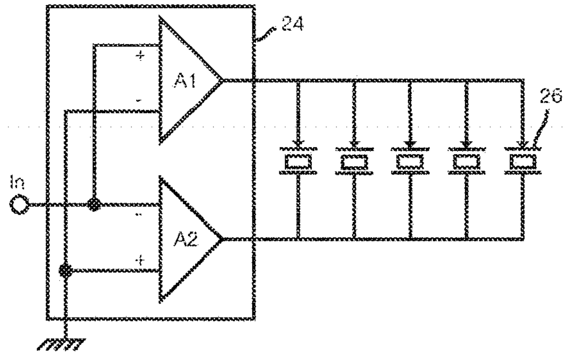
FIG. 3 is a block diagram, of a group comprising 5 piezoelectric transducers and a bridge-structure type buffer device, according to one form of the present disclosure.
Figure 4:
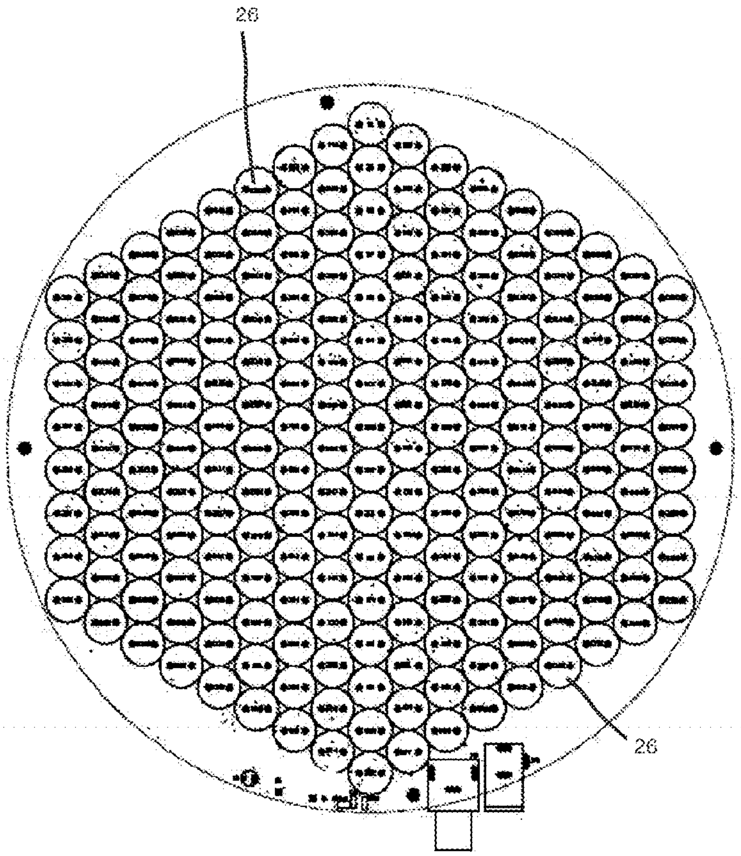
FIG. 4 is a schematic of a matrix formed by piezoelectric transducers, according to one form of the present disclosure.

The sound source of the loudspeaker 10 comprises a matrix formed by the piezoelectric transducers 26, as illustrated by FIG. 4. The piezoelectric transducers 26 allow converting an electrical signal received at input into ultrasonic acoustic waves. In the form of FIG. 4, 200 piezoelectric transducers 26 are used. The piezoelectric transducers 26 of the matrix are distributed in groups, each group comprising a number n of piezoelectric transducers and a buffer device 24. Such a group, comprising 5 piezoelectric transducers 26 and a bridge-structure type buffer device 24, is illustrated in the example of FIG. 3. In particular, the number n of piezoelectric transducers 26 is determined by the electrical characteristics of the buffer devices and the piezoelectric transducers 26, in particular the capacitance supported by each buffer device 24. For each group, the piezoelectric transducers 26 are coupled to the buffer device in parallel. For each group, the buffer device 24 is coupled to the signal processor 14 so as to receive the modulated signal MOD in the analog field.

For each group, the buffer device 24 is a buffer device acting on the voltage of the modulated signal MOD, still without substantially modifying it, and in particular allowing adapting the impedance between the output of the signal processor 14 and the piezoelectric transducers 26. Typically, the buffer device 24 may comprise at least one operational amplifier connected as a voltage follower, having a unitary voltage gain and a high current gain. Thus, the voltage observed at the output of each buffer device 24 is substantially equal to the voltage observed at the input, at the output of the signal processor 14. The impedance observed at the output of each buffer device 24 is significantly lower than the impedance at the input. In one form, the buffer device 24 comprises A or AB operation class amplifying means, configured to operate in linear mode. The components of the buffer device 24, and in particular the operational amplifier, allow in particular delivering a considerable output current, and are adapted to withstand unlimited capacitive loads introduced by the piezoelectric transducers 26.

In an advantageous form, illustrated in FIG. 3, each buffer device 24 comprises two bridge-connected operational amplifiers, allowing in particular delivering at the terminals of the piezoelectric transducers 26 of the group a signal the voltage of which is doubled in comparison with the voltage of the input signal. Thus, for the same input voltage, it is possible to deliver more power at the terminals of the piezoelectric transducers 26. As example, by using a 24V direct current power supply to power the buffer device 24, the two bridge-connected operational amplifiers allow delivering at the terminals of the piezoelectric transducers 26 of the group a theoretical sinusoidal voltage of 48V peak excluding losses, namely substantially between 10 and 16Veff. It is then possible to optimize and/or maximize the power received by the piezoelectric transducers 26 and/or to approach the maximum performance of the latter. For example, an operational amplifier adapted to be used in such a buffer device 24 is the operational amplifier with the reference LM7321 produced by Texas Instrument™, said reference corresponding to amplifiers having in particular the characteristic of being extremely compact, typically smaller than 1 $cm^2$.

Figure 5:
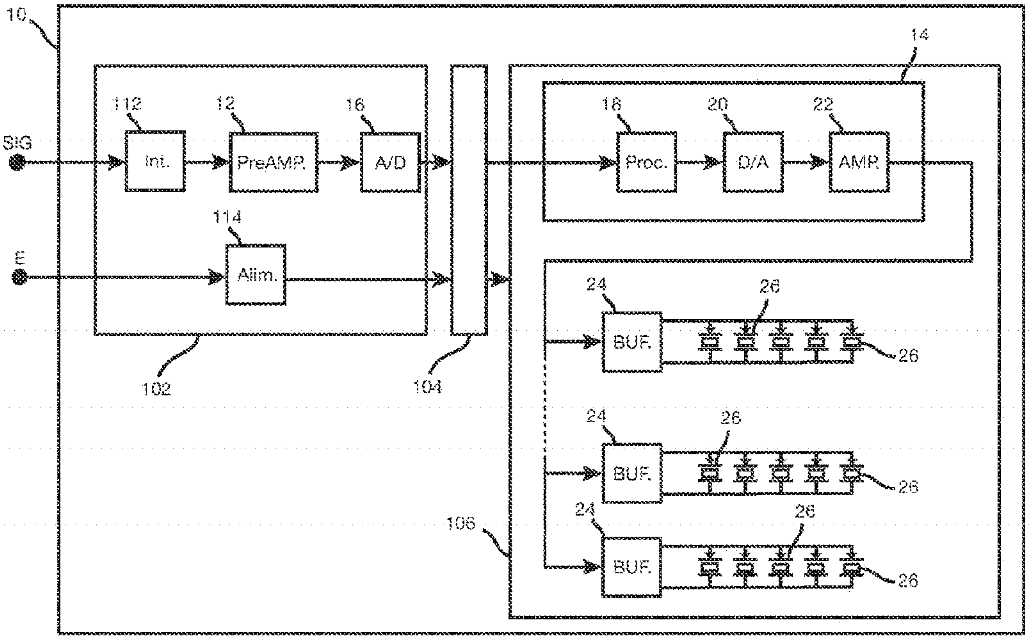
FIG. 5 is a block diagram of a unidirectional loudspeaker, according to a second form of the present disclosure.

A second form of a modular unidirectional loudspeaker, schematically illustrated by FIG. 5, will now be described. The loudspeaker 10 includes an interface module 102 coupled to an emitter module 106 via a coupling element 104. Advantageously, the interface module 102 and the emitter module 106 are disposed on distinct mechanical supports, and may therefore be detached. Thus, it is possible to couple the emitter module 106 to all the different types of interface modules which can be supported by the coupling element 104. Thus, it is possible to change and/or modify the interface module 102, and therefore manage different types of input signals SIG, while keeping the emitter module 106.

The interface module 102 includes an interconnection module 112 adapted to enable the mechanical, physical, electrical and logical coupling necessary to the receive of the electrical signal SIG from an external audio source. As example, the interconnection module 112 may include a "Jack"-type physical connector for receiving a symmetric or asymmetric signal at a line level as well as the electronic means for adapting the input impedance to a desired level. The interconnection module 112 may also include one or several physical connector(s) of another type, for example RCA or optical connectors. The interconnection module 112 may also include one or several digital interface(s), for example a USB or serial compatible interface. The interconnection module 112 still may include one or several communications interface(s), for example a data network access module of the WiFi type, Bluetooth® type, Ethernet type or radiocommunication type such as the GSM or the 3G network. The interface module 102 still includes a power-supply module 114 adapted to receive and/or supply the electrical energy necessary to power the interface module 102, the emitter module 106 and the coupling element 104. Thus, the power-supply module 114 may include a coupling means, for example an electrical socket, to be coupled to an electrical network and/or a batteries system. The power-supply module 114 may also include an electrical source, for example an accumulator, a batteries system or photovoltaic elements. The power-supply module 114 may also include means (for example a transformer, or still a rectifier) for adapting the electrical characteristics of the received electric current to the needs and characteristics of the interface module 102, emitter module 106 and/or coupling element 104. The power-supply module 114 may be configured to deliver a plurality of electric currents, having different characteristics. Typically, the power-supply module 114 is adapted to deliver a current the voltage of which is 24V direct current to power the buffer devices 24, and a current the voltage of which is 5V direct current to power the calculation module 18. The interface module 102 also includes, the amplifier 12, and the analog-digital conversion stage 16 so as to digitize the signal SIG leveled by the amplifier 12.

The coupling element 104 is configured so as to enable the mechanical coupling of the interface module 102 to the emitter module 106, and to enable the transmission to the calculation module 18 of the digitized signal SIG at the output of the analog-digital conversion stage 16 as well as the electric currents at the output of the power-supply module 114. Furthermore, the coupling element 104 may be configured so as to couple a plurality of emitter modules 106 in a chain fashion, and therefore to distribute the sound emissions over several emitter modules 106 from one single input signal SIG.

The emitter module 106 includes the signal processor 14—the digital calculation module 18, the digital-analog conversion stage 20, and the amplification stage 22—as well as the buffer devices 24 and the groups of piezoelectric transducers 26. Hence, the emitter module 106 and its configuration do not depend on the type of the signal SIG.

Figure 6:
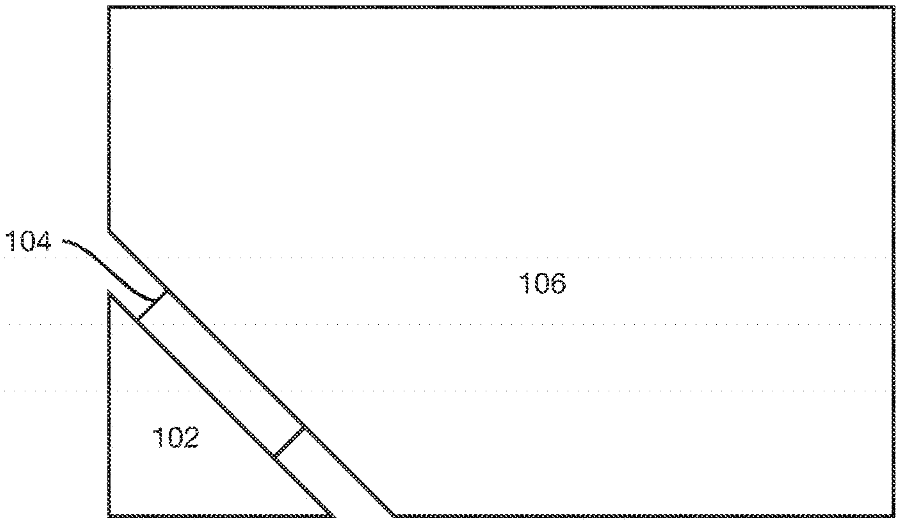
FIG. 6 is a schematic, according to a first form, of the mechanical supports on which the interface module, the emitter module and the coupling element may be disposed.

FIG. 6 illustrates, through a schematic, according to a first form, the mechanical supports on which the interface module 102, the emitter module 106 and the coupling element 104 may be disposed. In the first form, the mechanical support of the interface module 102 is substantially triangular-shaped, for example taking up the shape of a right-angled triangle. For example, the mechanical supports of the interface module 102 and the emitter module 106 consist of printed circuit boards. The arrangement and the shape of the mechanical supports, on which the interface module 102, the emitter module 106 and the coupling element 104 are disposed, are chosen so that once assembled the set has a substantially rectangular shape. Furthermore, the coupling element 104 may be configured so that the interface module 102 and the emitter module 106 are spaced apart by at least 3 millimeters. In this form, the emitter module is qualified as large-format and typically comprises 195 piezoelectric transducers 26. For example, the shape of the support of the emitter module 106 is an equivalent pentagon obtained by removing from a rectangular surface the triangular surface corresponding to the mechanical supports of the interface module 102. Typically, the dimensions of the support of the emitter module 106 are 16 cm in width for 21 cm in length. The piezoelectric transducers 26 are disposed in a hexagon fashion.

Figure 7:
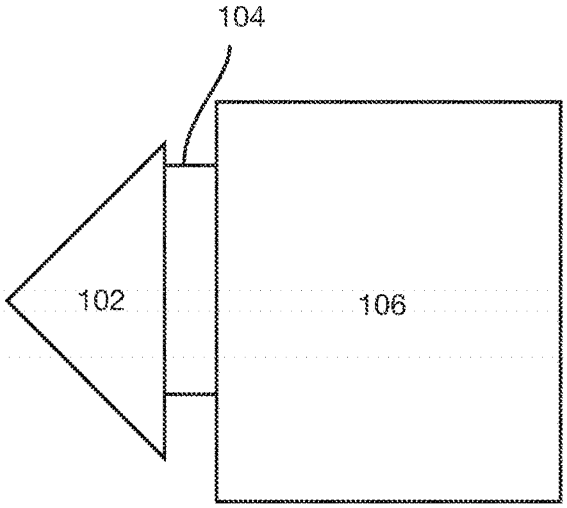
FIG. 7 is a schematic, according to a second form, of the mechanical supports on which the interface module, the emitter module and the coupling element may be disposed.

FIG. 7 illustrates, through a schematic, according to a second form, the mechanical supports on which the interface module 102, the emitter module 106 and the coupling element 104 may be disposed. In this second form, the mechanical support of the interface module 102 may have a shape substantially equivalent to the shape described in the first form illustrated in FIG. 6. The mechanical support of the interface module 102 is substantially triangular-shaped, for example taking up the shape of a right-angled triangle. The dimensions of the interface module 102 are typically chosen so that the hypotenuse of the right-angled triangle is smaller than or equal to the side of the emitter module 106. For example, the mechanical supports of the interface module 102 and the emitter module 106 consist of printed circuit boards. The coupling element 104 may be configured so that the interface module 102 and the emitter module 106 are spaced apart by at least 3 millimeters. In this form, the emitter module is qualified as small-format and typically comprises 40 piezoelectric transducers 26. For example, the shape of the support of the emitter module 106 is square or rectangular. Typically, the dimensions of the support of the emitter module 106 are 8 cm in width for 9 cm in length. The piezoelectric transducers 26 are disposed in a hexagon fashion.

Figure 8A:
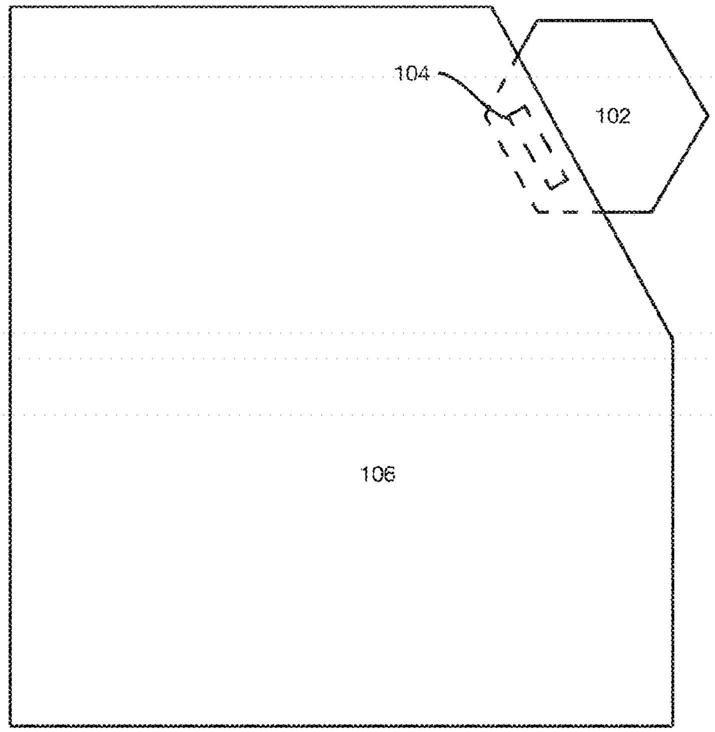
FIGS. 8*a* and 8*b* are a top view schematic and a bottom view schematic, according to a third form, of the mechanical supports on which the interface module, the emitter module and the coupling element may be disposed.
Figure 8B:
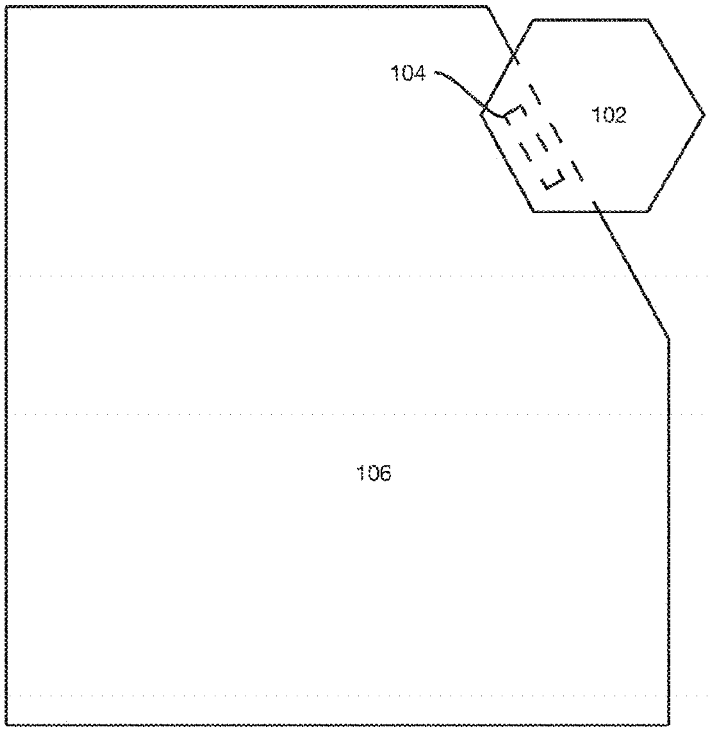

FIGS. 8*a* and 8*b* illustrate a third form of the mechanical supports on which the interface module 102, the emitter module 106 and the coupling element 104 may be disposed. FIG. 8*a* is a top view schematic: the piezoelectric transducers 26 (not represented in FIG. 8*a*) are disposed in a hexagon fashion at the side of the emitter module visible in FIG. 8*a*. FIG. 8*b* is a bottom view schematic. The coupling element 104 is disposed between the interface module 102 and the emitter module 106 so that the interface module 102 and the emitter module 106 are spaced apart by at least 3 millimeters. In this third form, the mechanical support of the interface module 102 may have a substantially hexagonal shape. For example, the mechanical supports of the interface module 102 and the emitter module 106 consist of printed circuit boards.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A loudspeaker adapted to convert an input electrical signal representing sound information into acoustic signals comprising:

a signal processor adapted to generate, at an output, from the input electrical signal, an electrical signal modulated by means of a carrier having a frequency substantially higher than 20 kHz;

a source capable of producing ultrasonic signals from the modulated electrical signal and diffusing said ultrasonic signals through a medium, wherein the carrier is chosen so that the acoustic signals are at least partially produced during crossing of the medium by the ultrasonic signals, and wherein the source comprises groups of at least two piezoelectric transducers, each group comprising a buffer device coupled between said at least two piezoelectric transducers of the group and the signal processor, the buffer device of each group being adapted to enable transmission of the modulated electrical signal to said at least two piezoelectric transducers of the group and to maintain the voltage observed at the terminals of said at least two piezoelectric transducers of the group substantially equal to the voltage observed at the output of the signal processor; and an interface module, adapted to be coupled to an emitter module, via a coupling element, the interface module further including means for receiving and converting the input electrical signal, into a digital signal, wherein the emitter module includes the signal processor and said source capable of producing ultrasonic signals from the digital signal and diffusing said ultrasonic signals through a medium, and wherein the interface module and the emitter module are disposed on distinct mechanical supports which can be detached.

2. The loudspeaker according to claim 1, wherein the buffer device of each group comprises A and/or AB operation class amplifying means.

3. The loudspeaker according to claim 1, wherein the buffer device of each group comprises at least one operational amplifier connected as a voltage follower, in linear mode and having a unitary voltage gain.

4. The loudspeaker according to claim 3, wherein the buffer device of each group comprises two bridge-connected operational amplifiers.

5. The loudspeaker according to claim 1, wherein the carrier used by the signal processor to generate the modulated electrical signal is an amplitude-modulation carrier.

6. The loudspeaker according to claim 1, wherein the carrier used by the signal processor to generate the modulated electrical signal is a frequency-modulation carrier.

7. The loudspeaker according to claim 1, wherein the carrier used by the signal processor to generate the modulated electrical signal is a pulse-width-modulation carrier.

8. The loudspeaker according to claim 1, wherein the carrier used by the signal processor for the modulated electrical signal has a frequency of at least 40 kHz.

9. The loudspeaker according to claim 1, wherein the signal processor comprises an amplification stage configured to adapt a voltage of the modulated signal to a nominal second level, upstream of the buffer devices.

10. The loudspeaker according to claim 1 further comprising an amplifier, disposed downstream of the signal processor, the amplifier configured to adapt a voltage of the input electrical signal to a nominal first level.

11. The loudspeaker according to claim 1, wherein the acoustic signals are produced in a substantially conical area the apex of which is located at the center of the source and within which a listener perceives an acoustic signal the level of which is attenuated by less than 50% in comparison with a maximum level of the acoustic signal, and the angle of which is smaller than 50°.

12. The loudspeaker according to claim 1, wherein the interface module includes a power-supply module adapted to receive and/or supply the electrical energy to power the interface module and the emitter module, and/or the coupling element.

13. The loudspeaker according to claim 1, wherein the mechanical supports of the interface module, the emitter module and the coupling module are configured so as to form, once secured, a substantially rectangular-shaped set.

14. The loudspeaker according to claim 1, wherein the mechanical support of the interface module is triangular-shaped.

* * * * *